United States Patent [19]

Senuma

[11] Patent Number: 5,264,922
[45] Date of Patent: Nov. 23, 1993

[54] LOGICAL COMB FILTER

[75] Inventor: Toshitaka Senuma, Tokyo, Japan

[73] Assignee: Sony Corporation, Tokyo, Japan

[21] Appl. No.: 666,604

[22] Filed: Mar. 8, 1991

[30] Foreign Application Priority Data

Mar. 8, 1990 [JP] Japan .................................. 2-57382

[51] Int. Cl.$^5$ .............................................. H04N 9/64
[52] U.S. Cl. .................................... 358/31; 358/21 R
[58] Field of Search ........................ 358/31, 36, 21 R

[56] References Cited

U.S. PATENT DOCUMENTS

| 4,050,084 | 9/1977 | Rossi | 358/21 R |
| 4,809,060 | 2/1989 | Saeki | 358/31 |
| 5,025,311 | 6/1991 | Hosoi | 358/31 |

FOREIGN PATENT DOCUMENTS

| 0321312 | 6/1989 | European Pat. Off. | |
| 0129891 | 8/1983 | Japan | 358/31 |
| 0039184 | 3/1984 | Japan | 358/31 |
| 0151592 | 8/1984 | Japan | 358/31 |
| 01/303891 | 2/1990 | Japan | |

OTHER PUBLICATIONS

IEEE FKT Fernseh-und Kino-Technik 44(1990), No. 2, "Neuere Entwicklungen bei Betacam", pp. 80-81 and 55.

Primary Examiner—Alvin E. Oberley
Assistant Examiner—Minsun Oh
Attorney, Agent, or Firm—Hill, Steadman & Simpson

[57] ABSTRACT

A logical comb filter comprising a logic decision section for making logical decisions on the selection of signals and a signal generating section for generating signals to be selected according to the logical decisions made by the logic decision section. In the signal generating section, a band pass filter extracts from the input of a composite video signal a signal component centering on a color subcarrier frequency, and a first and a second delay line generate three line signals based on an inverted output downstream of the band pass filter. The inverted output is a main signal. The line signals are apart from one another by one horizontal scanning period. The signal generating section further comprises a first mean level calculator for calculating the mean level between the main signal and a first delay signal obtained as the inverted output downstream of the first delay line, and a second mean level calculator for calculating the mean level between the first delay signal and a second delay signal obtained as the inverted output downstream of the second delay line. One of the output signals and the first delay signal is selected by a changeover switch. In the logical decision section, comparisons are made between the three line signals in terms of level and, if the level of the first delay signal falls between the other two signal levels, the changeover switch selects the first delay signal; otherwise the output signal of the first or second mean level calculator is selected in accordance with the level relationship between the three line signals.

2 Claims, 9 Drawing Sheets

LOGICAL COMB FILTER

BACKGROUND OF THE INVENTION

1. Field of the Invention

The present invention relates to a novel logical comb filter and, more particularly, to a logical comb filter used by video apparatus to separate the luminance signal (Y) from the chrominance signal (C) therein.

2. Description of the Prior Art

The so-called logical comb filter has been known and used to separate vertically the luminance signal (Y) from the chrominance signal (C) in video apparatus. What this filter does is to have logic circuits carry out comparisons of three line signals of the past (1 horizontal scanning period earlier), present and future (1 horizontal scanning period later) so as to minimize signal irregularities (dot disturbance, discoloring, etc.) resulting from the use of the signals with low vertical correlation.

FIG. 6 shows a typical logical comb filter "a" of the NTSC standard. In the figure, reference character "b" designates an input terminal through which a composite signal (hereinafter called $(Y+C)_I$) is input. The input signal $(Y+C)_I$ is sent via a 1H delay line "c" to a subtracter "d". The input terminal is also sent to a band pass filter "e" whose center frequency is $f_{sc}$ (color subcarrier frequency).

The signal in the vicinity of $f_{sc}$, when extracted by the band pass filter "e", is placed onto a 1H delay line "g" via a NOT circuit "f" (the output signal from the NOT circuit "f" is called $\overline{A_0}$; The symbol "-" means an inversion of phase effected on the output signal from the band pass filter "e".). The signal on the 1H delay line "g" is then sent to a NOT circuit "h" that generates a signal delayed by 1H relative to the signal $\overline{A_0}$ (called signal $A_1$).

In addition, a 1H delay line "i" and a NOT circuit "j" downstream thereof provide a signal (called signal $\overline{A_2}$) delayed by 1H relative to the signal $A_1$.

The three line signals $\overline{A_0}$, $A_1$ and $\overline{A_2}$, obtained with the 1H time spacing therebetween, are processed by logic operation units "k" and l (these units comprise MAX and MIN circuits, the MAX circuits extracting the signals whose levels are the highest, the MIN circuits extracting the signals whose levels are the lowest).

Specifically, in the logic operation unit "k", the signals $\overline{A_0}$ and $A_1$ are input to a MIN circuit "m" and the signals $A_1$ and $\overline{A_2}$ to a MIN circuit "n". The outputs from the MIN circuits "m" and "n" are sent to a MAX circuit "o" whose output is in turn sent to an adder "p".

In the logic operation unit l, the signals $\overline{A_0}$ and $A_1$ are input to a MAX circuit "q" and the signals $A_1$ and $\overline{A_2}$ to a MAX circuit "r". The outputs from the MAX circuits "q" and "r" are sent to a MIN circuit "s" whose output in turn is sent to the adder "p".

The output from the adder "p" is output as a C (chrominance) signal (called signal $C_0$) via a multiplier "t" having a coefficient of ½. The adder output is also sent to the subtracter "d" wherein the signal $C_0$ is subtracted from the 1H delayed signal of the input signal $(Y+C)_I$ to provide a luminance signal (called signal $Y_0$).

In the above-described logical comb filter "a", the three line signals $\overline{A_0}$, $A_1$ and $\overline{A_2}$ are processed according to the following two algorithms:

(1) If the level of the signal $A_1$ is between those of the signals $\overline{A_0}$ and $\overline{A_2}$, the signal $A_1$ is adopted as the signal $C_0$.

It is assumed that $V_0$, $V_1$ and $V_2$ designate the levels of the signals $\overline{A_0}$, $A_1$ and $\overline{A_2}$, respectively. If $V_0 < V_1 < V_2$ or if $V_0 > V_1 > V_2$, then the intermediate level signal $A_1$ is output as the signal $C_0$.

For example, the case where $V_0 < V_1 < V_2$, as conceptually illustrated in FIG. 7 (A), is considered. In FIG. 7, the vertical axis stands for delay times $\tau$ and the vertical axis for signal levels V. The levels $V_0$, $V_1$ and $V_2$ are indicated by hollow circles (○).

In the logic operation unit "k" of the case above, the MAX circuit "o" selects the signal $A_1$, which has the higher signal level and is obtained by the MIN circuit "n", in preference to the signal $\overline{A_0}$ acquired by the MIN circuit "m"; the selected signal $A_1$ is sent to the adder "p". In the logic operation unit l, the MIN circuit "s" selects the signal $A_1$, which has the lower signal level and is obtained by the MAX circuit "q", in preference to the signal $\overline{A_2}$ acquired by the MAX circuit "r"; the selected signal $A_1$ is sent to the adder "p". It follows that the mean output level obtained by the adder "p" and the multiplier "t" is $V_1$, which is exactly the same as in the case where the signal $A_1$ is adopted. The other algorithm is:

(2) If the level of the signal $A_1$ is not between those of the signals $\overline{A_0}$ and $\overline{A_2}$, the mean level between the signal $A_1$ and the either signal whose signal level is the closer to that of the former is adopted as the output level of the signal $C_0$.

That is, if $V_1 > V_2$ or $V_1 < V_0$ where $V_0 < V_2$ or, conversely, if $V_1 < V_2$ or $V_1 > V_0$ where $V_0 > V_2$, a comparison is made between $|V_1 - V_0|$ and $|V_1 - V_2|$. What is adopted here is the mean level between $V_1$ and the signal level ($V_0$ or $V_2$) which is the lower of the two.

For example, in the logic operation unit "k" and where $V_0 < V_2 < V_1$, as depicted in FIG. 7 (B), the MAX circuit "o" selects the signal $\overline{A_2}$, which is obtained by the MIN circuit "n" and has the higher signal level, in preference to the signal $\overline{A_0}$ acquired by the MIN circuit "m"; the selected signal $\overline{A_2}$ is sent to the adder "p". In the logic operation unit l, the MAX circuits "q" and "r" both yield the signal $A_1$; the signal $A_1$ is then sent from the MIN circuit "s" to the adder "p". What is adopted here is a signal with a level $(V_1 + V_2)/2$, the signal being acquired by the adder "p" and subtracter "t". That is, the mean output between the level $V_1$ and the level $V_2$ which is the closer of the remaining two to the former is used as the signal $C_0$.

In the above-described logical comb filter "a", the two kinds of signal processing are carried out as described centering on the signal $A_1$: (1) where vertical correlation between the three line signals is high, or (2) where the vertical correlation between the three line signals is low.

One disadvantage of the above logical comb filter "a" is that the logic operation units "k" and l comprise a large number of component devices. Another disadvantage of the prior art logical comb filter is that it is difficult to modify the circuit configuration thereof.

That is, many comparators used in the MIN and MAX circuits constituting the logic operation units "k" and l boost the number of gates, which pushes up the cost.

The reason that the circuit configuration is difficult to modify is that the decision on signal selection is not separated from the actual selection of signals in the logic operation units "k" and 1 (in fact, the two kinds of processing are mixed therein).

In the logical comb filter "a", any modification of or addition to the algorithms used requires major revisions in the configuration of the logic operation units. In that case, it is difficult to foresee how the eventual circuit configuration will turn out to be, because the existing arrangements hardly provide adequate guidelines to the modification or addition required.

For example, with the algorithms (1) and (2) described above, the Y/C separation is neatly carried out at a vertical edge involving transition from the portion with the chrominance signal to the portion without it. By contrast, where a vertical stripe pattern "v" of the Y signal having the $F_{sc}$ component appears on a monitor screen "u", irregularities occur at edges "w" and "w'".

FIG. 8 (B) conceptually describes the above situation. With respect to the lower edge "w'" of the stripe pattern "v", three lines, i.e., n-th, (n+1)th and (n+2)th, are extracted and partially illustrated.

FIG. 8B-1 shows how the luminance of the edge "w'" appears on the screen. In the figure, "H" stands for a bright portion and "L" for a dark portion.

FIG. 8B-2 depicts the situation in effect after signal passage through the band pass filter "e". Only those signals with large changes in luminance (i.e., at high frequencies) pass the filter on the n-th and (n+1)th scanning lines. The signal passage is blocked on the (n+2)th scanning line (as indicated by symbol "$\phi$").

FIG. 8B-3 illustrates the situation in effect after the phase is reversed. With the signal of the (n+1)th line taken as the center, the phase of that signal is opposite to that of the signal of the line on the n-5h line.

FIG. 8B-4 shows the situation in effect after processing is carried out by the logical comb filter "a" according to the above-described algorithm (2). In FIG. 8B-4, "H/2" and "L/2" mean that the luminance levels are about half that of the H portion and half that of the L portion, respectively.

That is, in FIG. 8B-3, the signal of the (n+1)th line is judged to be closer to the (n+2) line signal than to the n-th line signal whose phase is reversed by the algorithm (2).

For example, regarding the portion "x" enclosed by broken lines in FIG. 8B-2, the signal level $V_0$ of the n-th line and the signal level $V_1$ of the (n+1)th line are about $V_H$ after passage through the band pass filter "e", as depicted in the upper graphic representation of FIG. 8C. The signal level $V_2$ of the (n+2)th line is close to zero.

The output of the band pass filter "e" is reversed in phase every time the output is delayed by 1H by the NOT circuit "f" downstream of the filter or by the NOT circuits "h" and "j" downstream of the 1H delay lines "g" and "i". Thus the signal level of the n-th line is $-V_0$ (the signal level $V_2$ remains at approximately zero after phase reverse wherein $V_2 \approx 0$).

In this manner, the signal level $V_1$ is judged to be the closest to the signal level $V_2$ according to the algorithm (2). The mean value $V_{12}$ (=$(V_1+V_2)/2 \approx V_1/2$) is adopted as the $C_0$ signal.

Where the algorithm (2) is to be followed, the mean value is obtained between $V_1$ and the signal level close thereto. This means that the emphasis is on the processing of the chrominance signal regarding the $f_{sc}$ component of the signal. Thus the $f_{sc}$ component of the Y signal is adopted as the C signal and processed as such.

This disadvantage is avoided by the following measure: Where the levels of the three line signals are in a specific relation with one another, these levels may be judged to be the $f_{sc}$ component of the Y signal and may be suppressed from getting output as the signal $C_0$. For example, the average may be obtained between the two farthest signal levels.

In the example above, as shown in the lower graphic representation of FIG. 8C, the signal levels $V_1$ and $-V_0$ are averaged, the latter being the farthest from the former, i.e., $V_{12} = (-V_0 + V_1)/2 \approx 0$. In that case, the mean level is not regarded as the chrominance signal. Instead, the level $V_H$ is extracted unmodified as the level of the signal $Y_0$.

What has been considered above has focused on the bright portion "x". The same applies to the transition from the dark portion next to the bright portion "x" to the next adjacent bright portion (the only difference is in signal levels).

Where the level relationship between the three line signals is judged to be the $f_{sc}$ component of the Y signal as described, a new algorithm (3) is adopted. The algorithm (3) is stipulated as follows:

If there is a need to regard the level of the signal $A_1$ as the Y signal even though the signal level does not fall between the levels of the signals $\overline{A}_0$ and $\overline{A}_2$, the mean level between $V_1$ and the signal level farthest therefrom is adopted as the output level of the signal $C_0$.

The trouble is that when it comes to practicing the algorithm (3) above, it has been conventionally difficult even to envisage the kind of improvement that would be needed for the construction of the logic operation units "k" and 1.

SUMMARY OF THE INVENTION

It is therefore an object of the present invention to overcome the above and other deficiencies and disadvantages of the prior art and to provide a novel logical comb filter that will improve the prior art.

In achieving the above and other objects of the present invention and according to one aspect thereof, there is provided a logical comb filter for video signals comprising a first delay line, a second delay line connected to the first delay line serially, a first mean level calculator connecting its input terminals to an input and an output terminal of the first delay line, a second mean level calculator connecting its input terminals to an input and an output terminal of the second delay line, a changeover means connecting its input terminals to an output of the first delay line and the output terminals of the first and second mean level calculators, and a control logic unit connecting its input terminals to the input and output terminals of the first and second delay lines.

The logical comb filter of the above-described construction comprises a logical decision section for selecting signals and a signal generating section for generating signals to be selected by the logical decision section. The signals to be selected are determined in advance; all that the logical decision section does is to select one of these signals. This means that the circuit configuration is made simpler and that it is easy to modify the circuitry involved. Where the algorithm (3) is to be added anew, the logical decision section is additionally equipped with a logic operation unit that operates on the algorithm (3). An appropriate signal is selected according to a changeover signal generated by the added logic operation unit.

BRIEF DESCRIPTION OF THE DRAWINGS

FIGS. 8B-1 through 8B-4 are views conceptually illustrating what happens at vertical edges of the fsc component of the luminance signal in the prior art logical comb filter.

DESCRIPTION OF THE PREFERRED EMBODIMENT

One preferred embodiment of the present invention will now be described with reference to the accompanying drawings.

Figure 1:
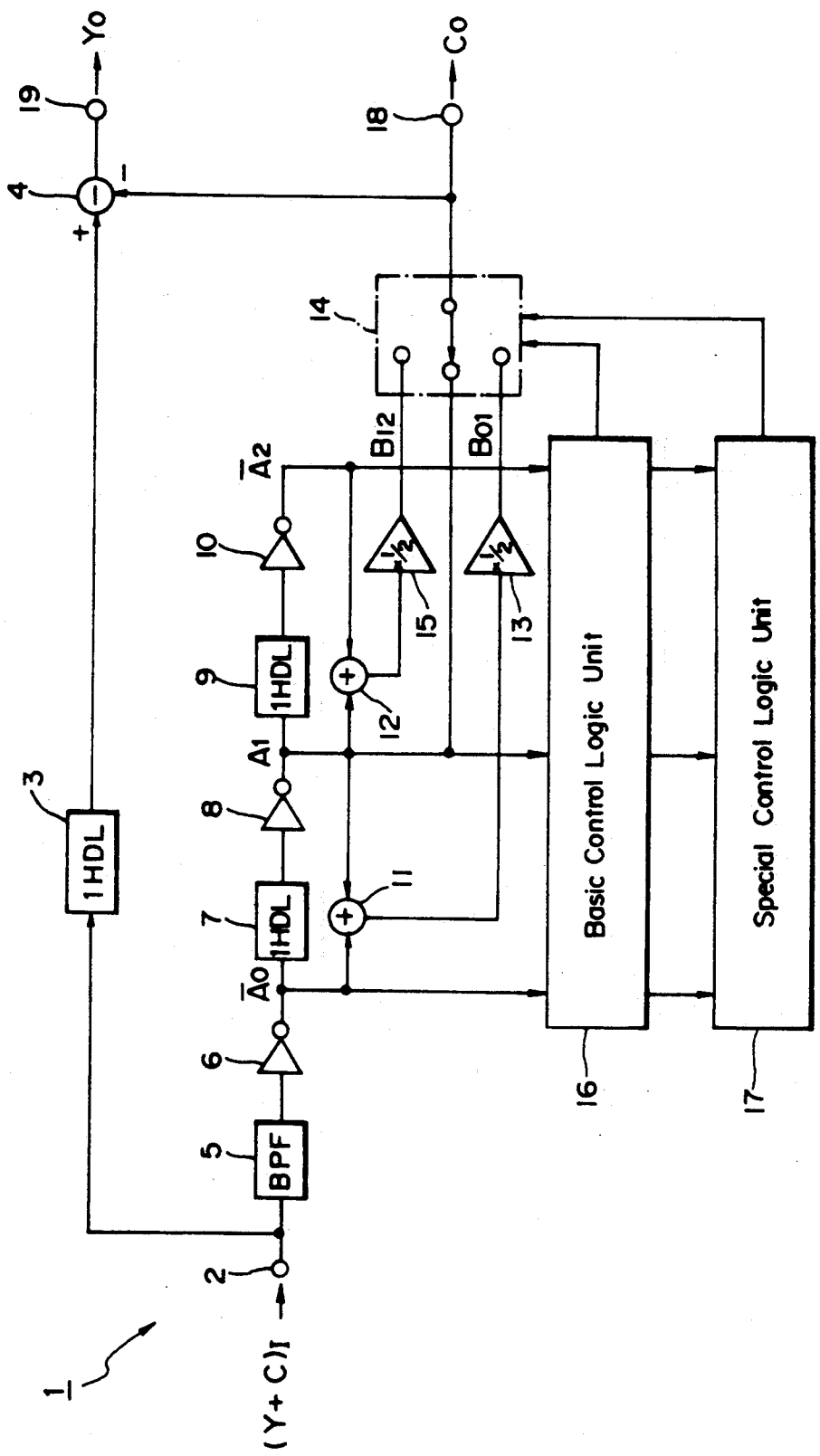
FIG. 1 is a circuit block diagram of one logical comb filter for video signals, the filter embodying the present invention.

FIG. 1 outlines the construction of a logical comb filter 1 as the preferred embodiment of the invention. In FIG. 1, reference numeral 2 is a signal input terminal through which a signal $(Y+C)_I$ is input.

The input signal $(Y+C)_I$ branches into two components, one being sent to a subtracter 4 via a 1H delay line 3 and the other to a band pass filter 5.

The band pass filter 5 is designed to let pass the signal component with its center at $f_{sc}$. The output of the band pass filter 5 is sent to a 1H delay line 7 via a NOT circuit 6. In turn, the 1H delay line 7 sends a signal delayed by 1H relative to the input signal $\overline{A}_0$ to a downstream 1H delay line 9 via a NOT circuit 8.

The 1H delay line 9 supplies a NOT circuit 10 with a signal delayed by another 1H relative to the input signal $A_1$. This provides a signal $\overline{A}_2$.

Reference numerals 11 and 12 are adders. The adder 11 admits the signal $\overline{A}_0$ from the NOT circuit 6 and the signal $A_1$ from the NOT circuit 8. The output of the addition is sent from the adder 11 to a multiplier 13 having a coefficient of ½. The output of the multiplier 13 (the output is called signal $B_{01}$; the level of this signal $(V_0$ is $+V_1)/2$) is sent to a changeover switch 14.

The other adder 12 admits the signal $A_1$ from the NOT circuit 8 and the signal $\overline{A}_2$ from the NOT circuit 10. The output of the addition from the adder 12 is sent to a multiplier 15 having a coefficient of ½. The output of the multiplier 15 (the output is called signal $B_{12}$; the level of this signal is $(V_1+V_2)/2$) is sent to the changeover switch 14.

Besides admitting the signals $B_{01}$ and $B_{12}$, the changeover switch 14 also receives the signal $A_1$ from the NOT circuit 8. In accordance with a signal received from a control logic unit to be described later, the changeover switch 14 selects one of the signals $B_{01}$, $B_{12}$ and $A_1$ for output.

The control logic unit comprises a basic control logic unit 16 and a special control logic unit 17. The basic control logic unit 16 makes decisions on the processing according to the algorithms (1) and (2) described earlier. The special control logic unit 17 makes decisions on the processing in accordance with the algorithm (3). Each control logic unit receives three line signals $\overline{A}_0$, $A_1$ and $\overline{A}_2$. The result of a decision by each control logic unit is sent as a changeover signal to the changeover switch 14.

The signal selected by the changeover switch 14 is sent to a signal output terminal 18 and to the subtracter 4. This causes an output signal $C_0$ to appear at the signal output terminal 18. The subtracter 4 subtracts the signal $C_0$ from the composite video signal delayed by 1H by the 1H delay line 3, thus generating an output signal $Y_0$ that appears at a signal output terminal 19.

Below is a description of how the major parts of the embodiment centering on the basic control logic unit 16 operate.

Figure 2:
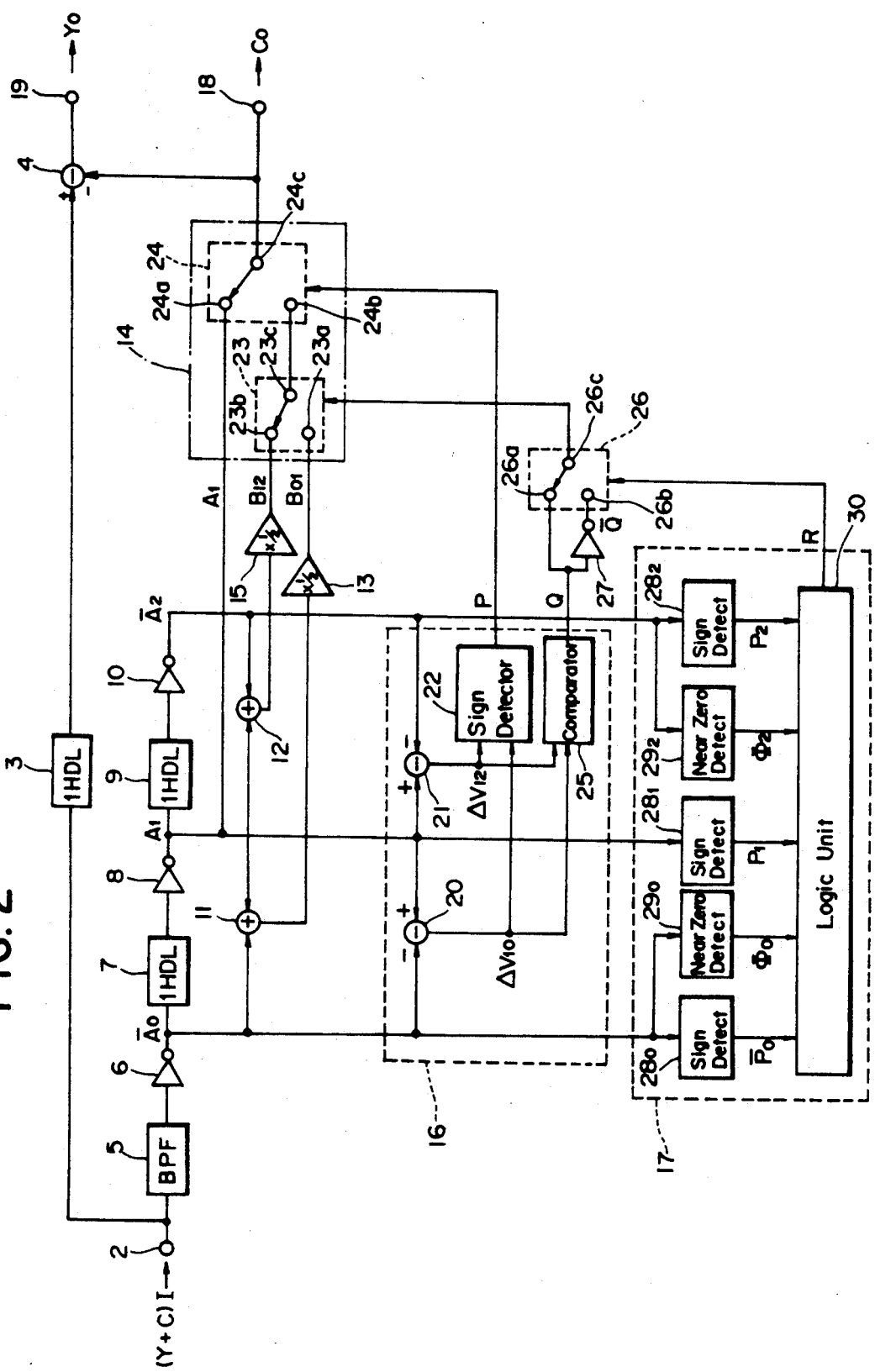
FIG. 2 is a circuit block diagram showing major parts of the embodiment.

In FIG. 2, reference numerals 20 and 21 are subtracters. One subtracter 20 admits the signals $A_1$ and $\overline{A}_0$, and the other subtracter 21 receives the signals $A_1$ and $\overline{A}_2$. Differential signals generated by the two subtracters 20 and 21 are sent to a sign detector 22.

The sign detector 22 checks to see if the signal level $V_1$ falls between levels $V_0$ and $V_2$ based on the differential signals from the subtracters 20 and 21 being positive or negative each. The result of the decision is generated by the sign detector 22 in the form of a signal (called signal P).

A case may be assumed in which $\Delta V_{10}=V_1-V_0$ and $\Delta V_{12}=V_1-V_2$. In that case, if the sign of the level $\Delta V_{10}$ of the differential signal from the subtracter 20 does not coincide with the sign of the level $\Delta V_{12}$ of the differential signal from the subtracter 21, then either $V_0<V_1<V_2$ or $V_2<V_1<V_0$. According to the algorithm (1), the signal $A_1$ is adopted. If the signal of $\Delta V_{10}$ matches that of $\Delta V_{12}$, the processing is carried out in accordance with the algorithm (2) or (3).

What has been described so far is summarized in the following table:

TABLE 1

| $\Delta V_{12}$ | $\Delta V_{10}$ | |
|---|---|---|
| | $\oplus$ | $\ominus$ |
| $\oplus$ | (2) or (3) | (1) |
| $\ominus$ | (1) | (2) or (3) |

In the table, the symbol $\oplus$ indicates that the signal level differential is positive; the symbol $\ominus$ indicates that the signal level differential is negative. Numbers (1), (2) and (3) designate the numbers of the algorithms to be followed.

The output signal P from the sign detector 22 has the logic level corresponding to the decision made as above. For example, if the algorithm (1) is to be followed, the signal P comprises a "1"; if the algorithm (2) or (3) is to be followed, the signal P comprises a "0". This signal P is sent to the changeover switch 14.

In FIG. 2, two switching elements 23 and 24 are used to express illustratively the switching action of the changeover switch 14 so that how the part works may be better understood.

The switching element 23 has two input terminals 23a and 23b. The terminal 23a receives the signal $B_{01}$ from the multiplier 13, and the terminal 23b the signal $B_{12}$ from the multiplier 15.

The switching element 24 also has two input terminals 24a and 24b. The terminal 24a receives the signal $A_1$ from the NOT circuit 8. The terminal 24b is given the signal ($B_{01}$ or $B_{12}$) selected by the switching element 23 via an output terminal 23c.

The action of the switching element 24 is controlled by the signal P from the sign detector 22. That is, when the signal P is "1", the contact is made at 24a. This allows the signal $A_1$ to be selected according to the algorithm (2). When the signal P is "0", the contact is made at 24b. This causes the signal $B_{01}$ or $B_{12}$ to be selected according to the algorithm (2) or (3).

A comparator 25 is provided to judge whether the signal level $V_1$ is closer (or farther from) to $V_0$ than to $V_2$ or vice versa. The comparator 25 admits the differential signals from the subtracters 20 and 21 and generates a signal (called signal Q) in accordance with the level $\Delta V_{10}$ being higher than the level $\Delta V_{12}$ or vice versa. Illustratively, the logic level of the signal Q is "1" when $|\Delta V_{10}| > |\Delta V_{12}|$, and "0" when $|\Delta V_{10}| < |\Delta V_{12}|$.

A switching element 26 has two input terminals 26a and 26b. The terminal 26a receives the above-mentioned signal Q. The terminal 26b admits a signal $\overline{Q}$ via a NOT circuit 27. The switching element 26 is operated according to the signal from the special control logic unit 17.

The signal Q or $\overline{Q}$ obtained from the output terminal 26c of the switching element 26 is used as the changeover signal for the switching element 23. That is, when the logic level of the signal Q or $\overline{Q}$ is "1", the signal $B_{12}$ is selected; when the logic level of the signal Q or $\overline{Q}$ is "0", the signal $B_{01}$ is selected.

To recapitulate, the basic control block described above operates as follows:

With respect to the algorithm (1), the sign detector 22 judges that the signal level $V_1$ is between $V_0$ and $V_1$. This causes the signal P to be sent to the changeover switch 14, thereby allowing the signal $A_1$ to be selected.

Figure 7A:
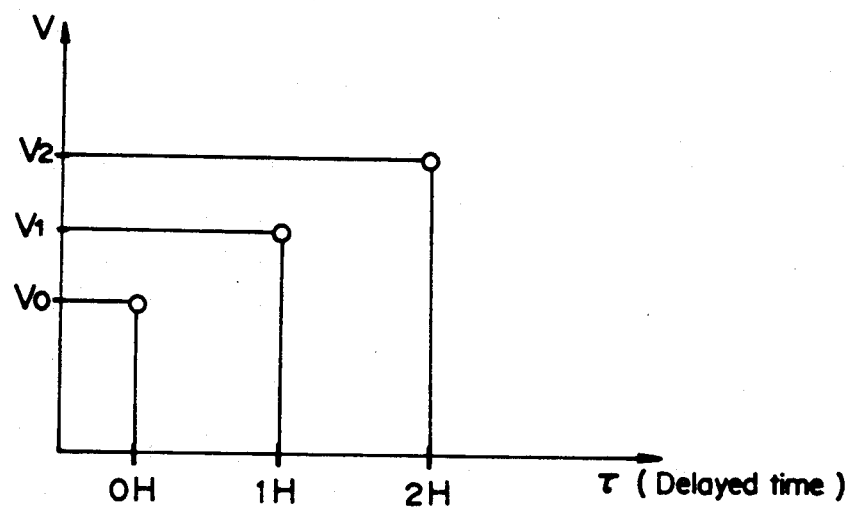
FIGS. 7A and 7B are views depicting how signal processing is carried out by the prior art logical comb filter.
Figure 7B:
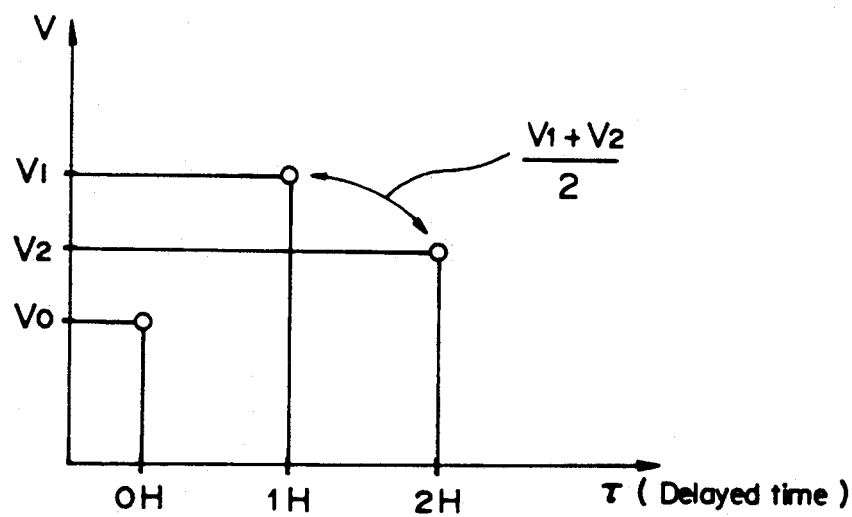

For example, in the case of FIG. 7 (A) (where $V_0 < V_1 < V_2$), the sign detector 22 judges that $\Delta V_{10} > 0$ and that $\Delta V_{12} < 0$. Because the two signs do not coincide with each other, the signal P is set to "1". This causes the contact of the switching element 24 to be made at 24a, allowing the signal $A_1$ to be output as the signal $C_0$.

With respect to the algorithm (2), the sign detector 22 judges that the signal level $V_1$ does not fall between $V_0$ and $V_2$. Thus the signal P is set to "0". This causes the contact of the switching element 24 to be made at 24b.

The comparator 25 judges that either the signal level $V_0$ or $V_2$ is the closest to $V_1$. As a result, the signal Q is sent to the switching element 23 via the switching element 26. This causes either the signal $B_{01}$ or $B_{12}$ to be selected.

For example, in the case of FIG. 7 (B) (where $V_1 > V_2 > V_0$), the sign detector 22 judges that $\Delta V_{10} > 0$ and that $\Delta V_{12} > 0$. Because the two signs coincide with each other, the signal P is set to "1". This causes the contact of the switching element 24 to be made at 24b. The comparator 25 judges that $V_2$ is closer to $V_1$, since $|\Delta V_{10}| > |\Delta V_{12}|$. This sets the signal Q to "1". In that case, the contact of the switching element 26 is considered to be made at 26a by the changeover signal from the special control logic unit, as will be described later. This causes the signal Q to be sent unchanged to the switching element 23. The contact of the switching element 23 is made at 23a, and the signal $B_{12}$ is selected.

The processing described above is summarized in the following table:

TABLE 2

| $\Delta V_{10}$ | $\Delta V_{12}$ | $|\Delta V_{10}| - |\Delta V_{12}|$ | P | Q | $S_{23}$ | $S_{24}$ |
|---|---|---|---|---|---|---|
| ⊕ | ⊕ | ⊕ | 0 | 1 | $B_{12}$ | $B_{12}$ |
| ⊕ | ⊕ | ⊖ | 0 | 0 | $B_{01}$ | $B_{01}$ |
| ⊕ | ⊖ | — | 1 | — | — | $A_1$ |
| ⊖ | ⊕ | — | 1 | — | — | $A_1$ |
| ⊖ | ⊖ | ⊕ | 0 | 1 | $B_{12}$ | $B_{12}$ |
| ⊖ | ⊖ | ⊖ | 0 | 0 | $B_{01}$ | $B_{01}$ |

In the table above, the symbols ⊕ and ⊖ have the same meaning as described in connection with Table 1. Symbol $S_{23}$ designates the signal to be selected by the switching element 23; $S_{24}$ denotes the signal to be selected by the switching element 24 (i.e., signal $C_0$); and — indicates that the corresponding value is unpredictable.

Prior to a description of the special control logic unit 17, there will be described specific relationships between the three line signals, the relationships being judged to justify the application of the algorithm (3) as special cases.

As described earlier, the irregularities in connection with the $f_{sc}$ component of the Y signal result from the uniform judgment that the $f_{sc}$ component of the input signal is always the chrominance signal.

Figure 3:
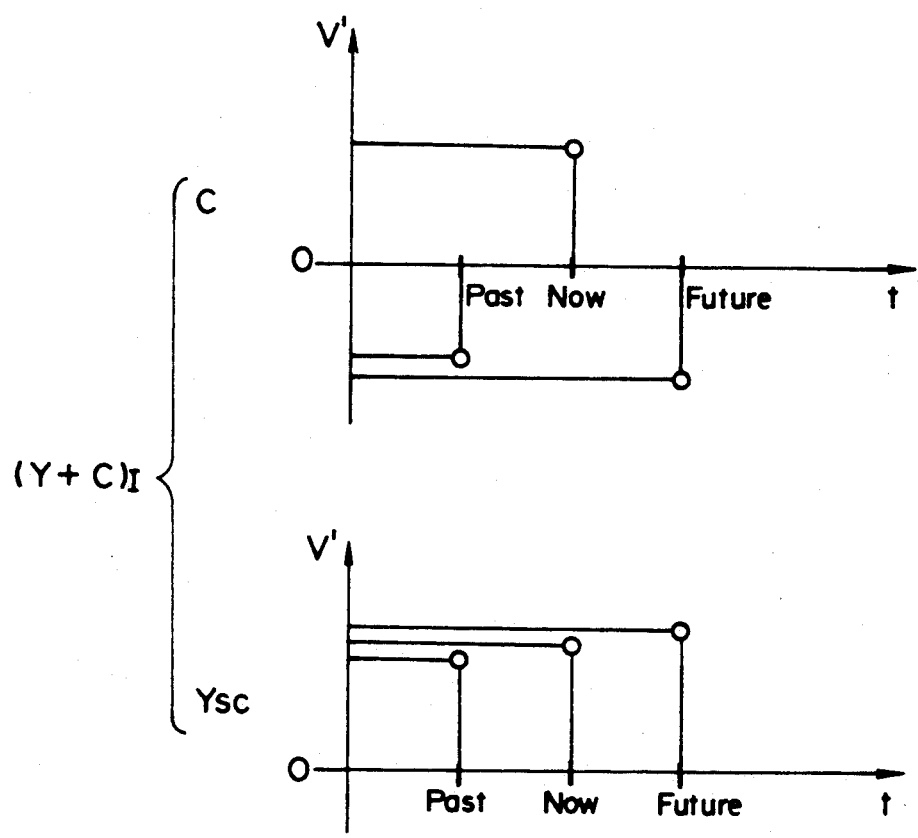
FIG. 3 is a view illustrating the level relationship of the $f_{sc}$ component of the chrominance and luminance signals where the vertical correlation involved is high in a special control logic unit of the embodiment.
Figure 4A:
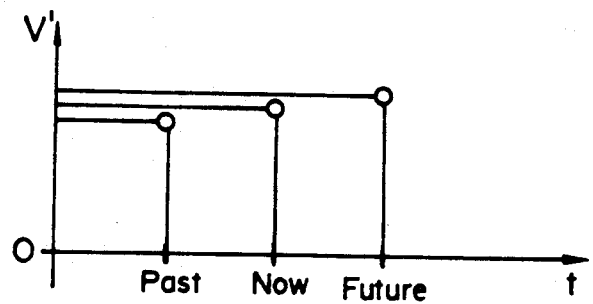
FIGS. 4A through 4C are views describing special cases where exceptional processing is carried out by the special control logic unit in the embodiment.
Figure 4B:
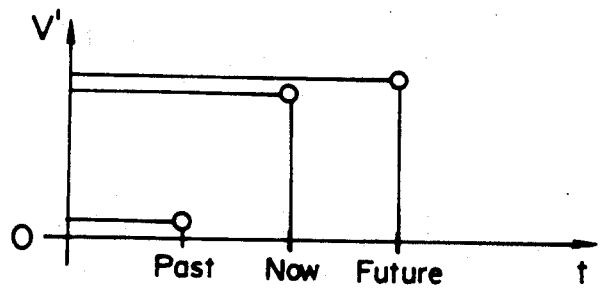
Figure 4C:
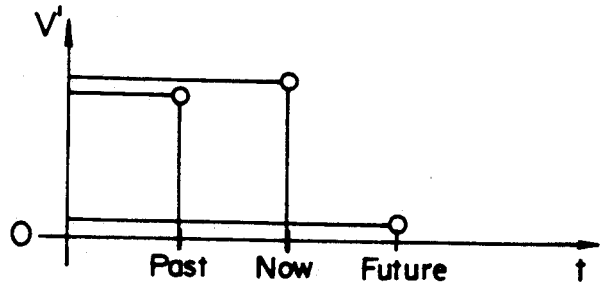
Figure 4D:
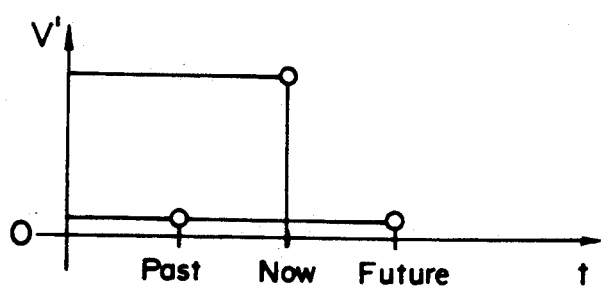

FIG. 3 illustrates the output signal levels (represented by "V") of the band pass filter 5 where three line signals under the NTSC standard have a high degree of vertical correlation with one another. In FIG. 3, reference character S stands for the C signal, $Y_{sc}$ for the $f_{sc}$ component of the Y signal, "t" for the time, and a hollow circle (◯) for the levels of the three line signals 1H apart from one another.

The C signal has its phase inverted for every scanning line because of the effect of the frequency interleaving involved. So when the degree of vertical correlation between the three line signals is high, the phase of the C signal is inverted on every horizontal scanning line, whereas the Y signal is supposed to keep its phase unchanged.

That is, it is necessary to distinguish the C signal from the Y signal in terms of the $f_{sc}$ component. Conventional attempts to carry out the processing uniformly using the algorithm (2) alone have resulted in the irregularities mentioned above.

Figure 8A:
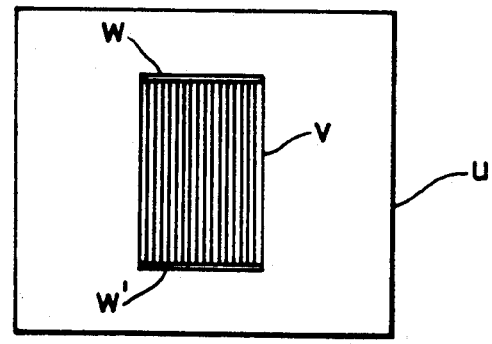
FIG. 8A is a view describing a phenomenon that occurs at a vertical edge of the $f_{sc}$ component of the luminance signal in the prior art logical comb filter.
Figures 1, 8B:
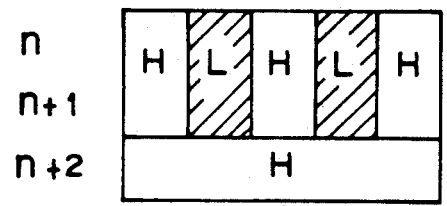
Figures 2, 8B:
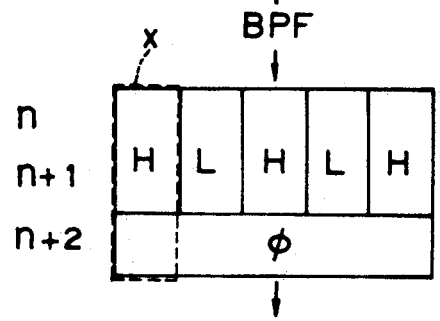
Figures 3, 8B:
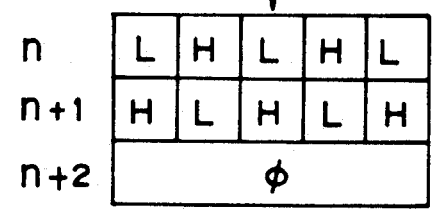
Figures 4, 8B:
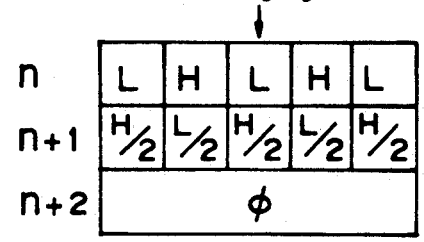
Figure 8C:
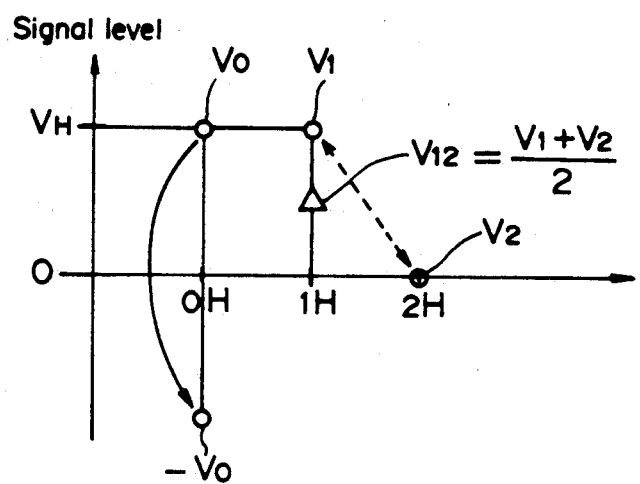
FIG. 8C is a view depicting what causes the phenomena at vertical edges of the $f_{sc}$ component of the luminance signal in the prior art logical comb filter.
Figure 8C:
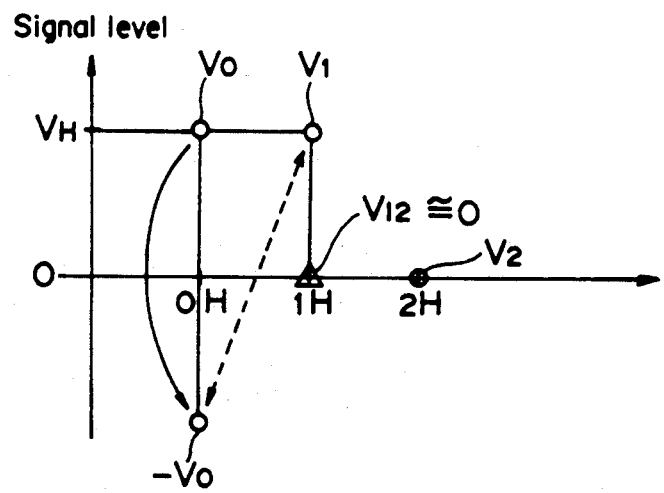

One solution to the problem above is implemented by applying the algorithm (3) to the illustrative cases in FIG. 4 (where correlations between signal levels are those immediately downstream of the band pass filter 5). In the case of FIG. 4 (A), the three line signals are in phase with one another and have a nonzero value each. In the cases of FIGS. 4 (B) and 4 (C), a 1H delay signal corresponding to a vertical edge exists. In the case of FIG. 4 (D), the signal levels around 1H are close to zero with respect to a nonzero 1H delay signal. In such cases, none of the signals involved is regarded as the C signal. Instead, the algorithm (3) mentioned above is applied.

The special control logic unit 17 is provided to detect the cases depicted in FIGS. 4 (A) through 4 (D) so as to select the mean level between the signal level $V_1$ and the level $V_0$ or $V_1$, whichever is closer to $V_1$.

In FIG. 2, reference numeral $28_i$ ($i=0, 1, 2$) is a sign detector provided to determine whether the input signal level is positive or negative; $29_i$ ($i=0, 2$) is a near-zero detector provided to determine whether or not the signal level is near zero.

In operation, the signal detector $28_0$ detects whether the signal level $V_0$ of the signal $\overline{A}_0$ is positive or negative. A signal ($\overline{P}_0$) reflecting the result of the decision is sent to a logic operation unit 30. The near-zero detector $29_0$ detects whether or not the level $V_0$ is near zero. Another signal ($\phi_0$) reflecting the result of the latter decision is also sent to the logic operation unit 30.

Regarding the signal $A_1$, only the sign detector $28_1$ is provided. The output signal of the sign detector $28_1$ (the signal is called $P_1$) is sent to the logic operation unit 30.

Regarding the signal $\overline{A}_2$, as with the signal $\overline{A}_0$, both the sign detector $28_2$ and the near-zero detector $29_2$ are provided. The output signal of the sign detector $28_2$ (this signal is called $\overline{P}_2$) and that of the near-zero detector $29_2$ (this signal is called $\phi_2$) are sent to the logic operation unit 30.

The line (-) over the reference characters $\overline{P}_0$ and $\overline{P}_2$ means that each corresponding signal is inverted. The three line signals shown in FIG. 4 indicate the signal levels immediately downstream of the band pass filter 5. Since sign detection is carried out in this example using the phase-inverted signals $\overline{A}_0$ and $\overline{A}_2$, it is necessary to interpret inversely the results of the sign detection regarding the signals $\overline{A}_0$ and $\overline{A}_2$.

That is, the logic level of the signal $P_1$ is set to "1" when the sign of $V_1$ is positive, and is set to "0" when the sign of $V_1$ is negative. Conversely, the logic level of the signal $\overline{P}_0$ or $\overline{P}_2$ is set to "0" when the sign of $V_0$ or $V_2$ is positive, and is set to "1" when the sign of $V_0$ or $V_2$ is negative.

The logic level of the signal $\phi_0$ or $\phi_2$ is set to "1" in case of a near-zero value; otherwise the logic level is set to "0".

The logic operation unit 30 makes decisions on the levels of the three line signals as depicted in FIG. 4 using such signals as the signal $\overline{P}_0$, $P_1$ and $\overline{P}_2$ from the sign detector $28_i$ ($i=0, 1, 2$) as well as the signal $\phi_i$ ($i=0, 2$) from the near-zero detector $29_i$ ($i=0, 2$).

Figure 5:
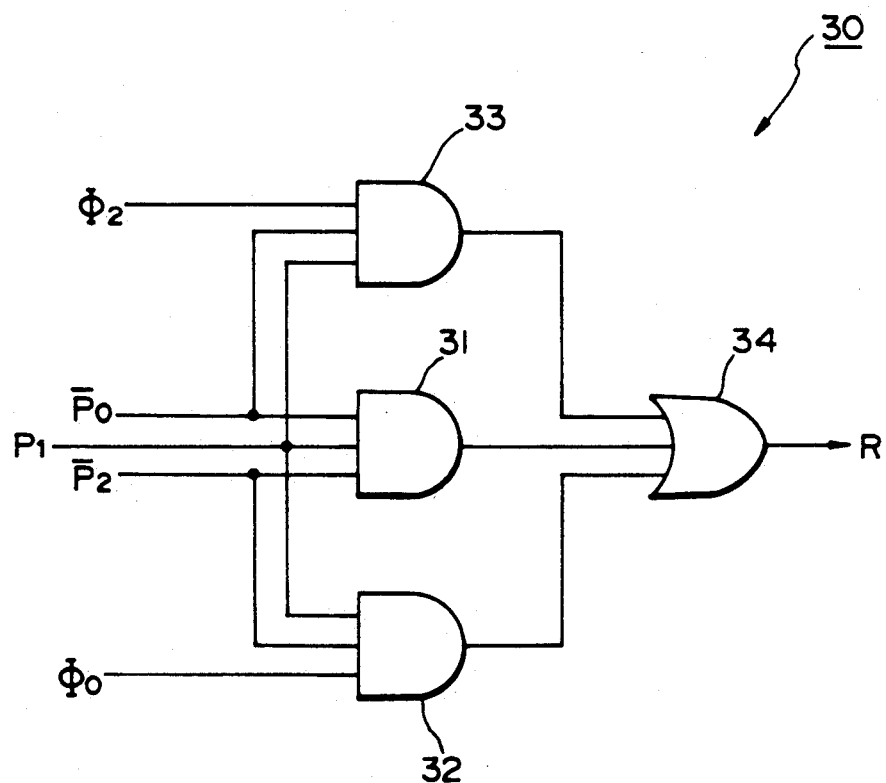
FIG. 5 is an equivalent circuit diagram of major parts of the special control logic unit in the embodiment.
Figure 6:
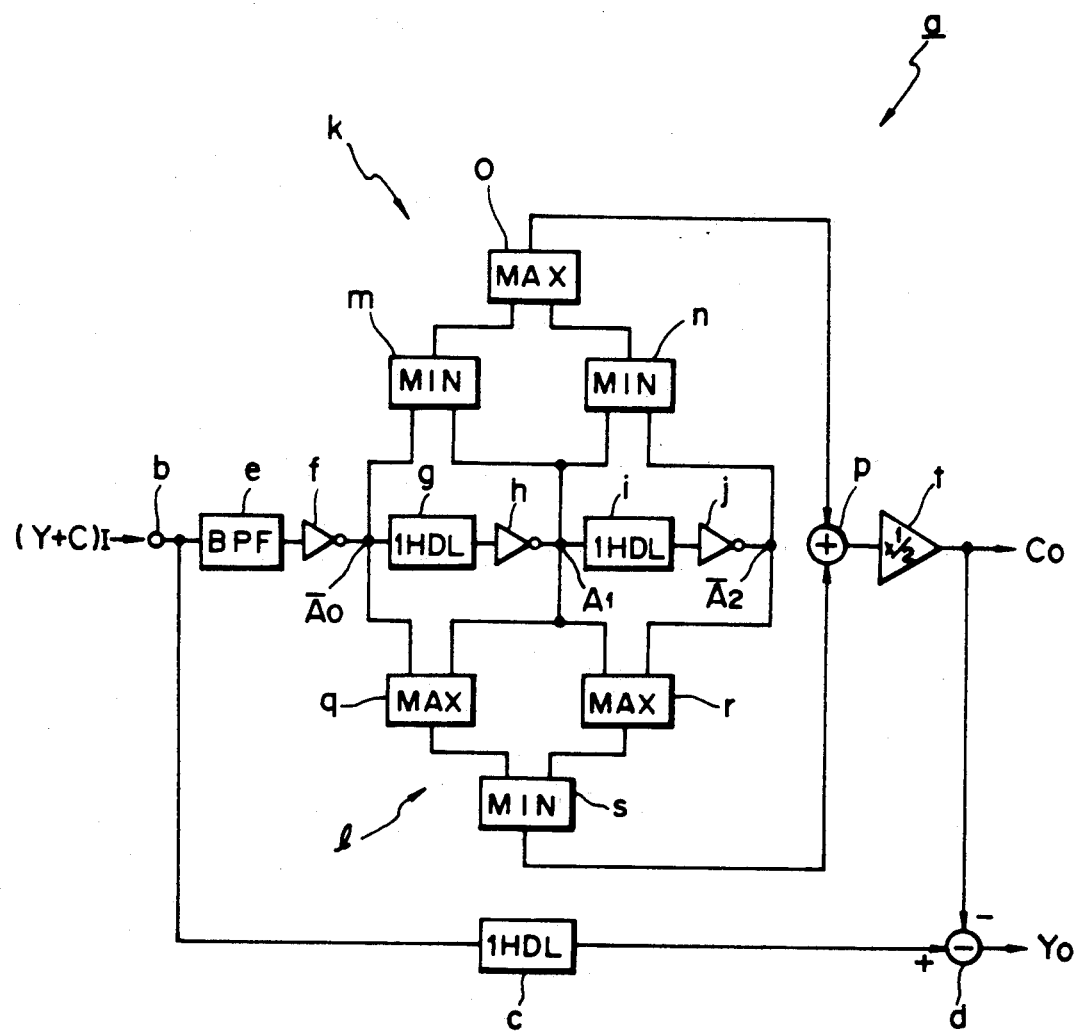
FIG. 6 is a circuit block diagram of one prior art logical comb filter.

FIG. 5 equivalently illustrates the processing performed by the logic operation unit 30 using logic circuits. In FIG. 5, the output signals $\overline{P}_0$, $P_1$ and $\overline{P}_2$ of the sign detector $28_i$ ($i=0, 1, 2$) are input to an AND circuit 31. When the output signal of the AND circuit 31 is High, that means the signs of all three line signals before phase inversion coincide with one another, as in the case of FIG. 4 (A).

The signals $P_1$, $\overline{P}_2$ and $\phi_0$ are input to a three-input AND circuit 32. If the output of the AND circuit 32 is High, that means the signal level correlation shown in FIG. 4 (B) is detected.

The signals $\overline{P}_0$, $P_1$ and $\phi_2$ are input to a three-input AND circuit 33. If the output signal of the AND circuit 33 is High, that means the signal level correlation in the case of FIG. 4 (C) is detected.

If the output signal level of the AND circuit 32 and that of the AND circuit 33 are High, that means the signal level correlation found in FIG. 4 (D) is detected.

These AND outputs are sent to a three-input OR circuit 34. The output signal (called R) of the OR circuit 34 is sent as the changeover signal to the switching element 26.

The logic level of the signal R is set to "1" when the cases of FIGS. 4 (A) through 4 (D) are detected by the logic operation unit 30, and is otherwise set to "0". That is, when the logic level of the signal R is "1", the contact of the switching element 26 is made at 26b. This causes the signal $\overline{Q}$ to be selected via the NOT circuit 27. When the logic level of the signal R is "0", the contact of the switching element 26 is made at 26a. This causes the signal Q to be selected.

The signal R is set to "1" when the special control logic unit 17 detects any of the cases of FIGS. 4 (A) through 4 (D) regarding the signal level correlation of the three line signals. This causes the switching element to select the signal $\overline{Q}$.

In this manner, the switching element 23 is supplied with the changeover signal $\overline{Q}$ reflecting the opposite of the role that the signal Q is to play in the basic control logic unit 16, the role being to find the mean level between $V_1$ and the level closest thereto.

That is, the signal $\overline{Q}$ is used to obtain the mean level between $V_1$ and the signal level farthest therefrom. When the signal R is set to "0", the signal Q is selected by the switching element 26.

The processing described above is summarized in the following table:

TABLE 3

| $\overline{P}_0$ | $P_1$ | $\overline{P}_2$ | $\Phi_0$ | $\Phi_2$ | R | $S_{26}$ |
|---|---|---|---|---|---|---|
| 1 | 1 | 1 | 0 | 0 | 1 | $\overline{Q}$ |
| 1 | 1 | — | — | 1 | 1 | $\overline{Q}$ |
| — | 1 | 1 | 1 | — | 1 | $\overline{Q}$ |
| 1 | 1 | 0 | — | 0 | 0 | Q |
| 0 | 1 | 1 | 0 | — | 0 | Q |
| 1 | 0 | 0 | — | — | 0 | Q |
| 0 | 1 | 0 | — | — | 0 | Q |
| 0 | 0 | 1 | — | — | 0 | Q |

In Table 3, symbol $S_{26}$ designates the signal to be selected by the switching element 26, and symbol "-" indicates that the corresponding value is unpredictable.

In the logical comb filter 1 described above, two groups of circuits are distinctly separated from each other. One group of circuits intended to generate the signals ($A_1$, $B_{01}$, $B_{12}$) to be selected by the changeover switch 14 comprises the band pass filter 5, delay lines 7 and 9, NOT circuits 6, 8 and 10, adders 11 and 12, and multipliers 13 and 15. The other group of circuits intended to make decisions on signal selection comprises the basic control logic unit 16 and special control logic unit 17. This means that the new algorithm (3) is readily added to the algorithms (1) and (2) in the basic control logic unit 16.

The reason for the ease of making the addition above is that the special control logic unit 17 comprises circuits intended only to make logical decisions on special cases of signal level correlation between the three line signals, those cases requiring special processing. All that is needed here is to suitably control the switching action of the changeover switch 15 in accordance with the result of each decision.

As described and according to one aspect of the present invention, there is provided the logical comb filter for video signals comprising the first delay line, the second delay line connected to the first delay line serially, the first mean level calculator connecting its input terminals to the input and output terminals of the first delay line, the second mean level calculator connecting its input terminals to the input and output terminals of the second delay line, the changeover means connecting its input terminals to the output of the first delay line and the output terminals of the first and second mean level calculators, and the control logic unit connecting its input terminals to the input and output terminals of the first and second delay lines.

The logical comb filter thus embodied according to the invention comprises the logical decision section for selecting signals and the signal generating section for generating signals to be selected by the logical decision section. The signals to be selected are determined in advance; all that the logical decision section does is to select one of these signals. This means that the circuit configuration is made simpler and that it is easy to modify the circuitry involved.

The logical comb filter described above is only one preferred embodiment of the present invention and in no way restricts the scope or spirit thereof. In the above description, FIGS. 4 (A) through 4 (D) illustrate typical cases to which the algorithm (3) is applied. Alternatives to such arrangements include one in which only the signs of signal levels are inverted for the necessary processing.

As many apparently different embodiments of this invention may be made without departing from the spirit and scope thereof, it is to be understood that the invention is not limited to the specific embodiments thereof except as defined in the appended claims.

What is claimed is:

1. A logical comb filter for video signals comprising:
a first delay line;
a second delay line connected to said first delay line serially;
a first mean level calculator connecting its input terminal to an input and an output terminal of said first delay line;
a second mean level calculator connecting its input terminals to an input and an output terminal of said second delay line;
a changeover means connecting its input terminals to an output of said first delay line and the output terminals of said first and second mean level calculators and having an output terminal manifesting a chrominance signal corresponding to a signal at one of said input terminals;
a control logic unit for controlling said changeover means connecting its input terminals to the input and output terminals of said first and second delay lines;
wherein said control logic unit comprises:
sign detectors connected to the input and output terminals of said delay lines; and
near-zero detectors connected to said delay lines.

2. A logical comb filter for video signals comprising:
a first delay line;
a second delay connected to said first delay line serially;
a first mean level calculator connecting its input terminals to an input and an output terminal of said first delay line;
a second mean level calculator connecting its input terminals to an input and an output terminals of said second delay line;
a changeover means having input terminals connected to an output of said first delay line and to the output terminals of said first and second mean level calculators for manifesting a chrominance signals connected from one of its said input terminals;
a control logic unit for controlling said changeover means connecting its input terminals to the input and output terminals of said first and second delay lines;
wherein said control logic unit comprises:
subtracters connecting their input terminals to the input and output terminals of said delay lines;
a sign detector connected to the output terminals of said subtracters; and
a comparator connected to the output terminals of said subtracters.

* * * * *